(12) United States Patent
Malik et al.

(10) Patent No.: US 9,461,262 B2
(45) Date of Patent: Oct. 4, 2016

(54) OPTOELECTRONIC DEVICE

(71) Applicant: CAMBRIDGE DISPLAY TECHNOLOGY LIMITED, Cambridgeshire (GB)

(72) Inventors: Surama Malik, Cambridge (GB); Julian Carter, Cambridge (GB); Laurence Scullion, Cambridgeshire (GB); Colin Baker, Cambridge (GB); Arne Fleissner, Regensburg (DE); Jeremy Burroughes, Cambridge (GB)

(73) Assignee: CAMBRIDGE DISPLAY TECHNOLOGY LIMITED, Cambridgeshire (GB)

( * ) Notice: Subject to any disclaimer, the term of this patent is extended or adjusted under 35 U.S.C. 154(b) by 0 days.

(21) Appl. No.: 14/385,486

(22) PCT Filed: Mar. 13, 2013

(86) PCT No.: PCT/GB2013/000109
§ 371 (c)(1),
(2) Date: Sep. 15, 2014

(87) PCT Pub. No.: WO2013/136039
PCT Pub. Date: Sep. 19, 2013

(65) Prior Publication Data
US 2015/0041787 A1    Feb. 12, 2015

(30) Foreign Application Priority Data
Mar. 16, 2012  (GB) .................................. 1204670.2

(51) Int. Cl.
*H01L 29/08*       (2006.01)
*H01L 51/50*       (2006.01)
(Continued)

(52) U.S. Cl.
CPC ....... *H01L 51/5088* (2013.01); *H01L 51/0035* (2013.01); *H01L 51/0038* (2013.01);
(Continued)

(58) Field of Classification Search
CPC ........... H01L 51/5275; H01L 51/0037; H01L 2251/5361
USPC .......................................................... 257/40
See application file for complete search history.

(56) References Cited

U.S. PATENT DOCUMENTS 4,539,507 A    9/1985  VanSlyke et al.
6,157,127 A    12/2000 Hosokawa et al.
(Continued)

FOREIGN PATENT DOCUMENTS

CN    1832647 A      9/2006
EP    2 372 805 A2   10/2011
(Continued)

OTHER PUBLICATIONS

"Low-Cost, Large Area Production of Flexible OLEDs a Step Closer," Press Release, Agfa Materials and Hoist Centre (2009). Retrieved from the Internet at URL:http://www.holstcentre.com/NewsPress/PressListlAgfa_ITOfree_OLED.aspx.
(Continued)

*Primary Examiner* — Elias M Ullah
(74) *Attorney, Agent, or Firm* — Marshall, Gerstein & Borun LLP

(57) ABSTRACT

This invention generally relates to an optoelectronic device and a method of fabricating such a device, and more particularly to an optoelectronic device comprising an anode layer, a semiconductive layer provided over the anode layer, and a cathode layer provided over the semiconductive layer, the anode layer comprising a plurality of electrically conductive tracks connected together and spaced apart from one another with gaps therebetween, the device further comprising a first and one or more further hole injection layers provided between the anode layer and the semiconductive layer and extending across said gaps, wherein the first hole injection layer has a conductivity greater than the conductivity of the one or more further hole injection layers.

20 Claims, 7 Drawing Sheets

(51) Int. Cl.
*H01L 51/44* (2006.01)
*H01L 51/52* (2006.01)
*H01L 51/56* (2006.01)
*H01L 51/00* (2006.01)

(52) U.S. Cl.
CPC ......... *H01L51/0039* (2013.01); *H01L 51/441* (2013.01); *H01L 51/445* (2013.01); *H01L 51/5212* (2013.01); *H01L 51/5275* (2013.01); *H01L 51/56* (2013.01); *H01L 51/0037* (2013.01); *H01L 2251/5361* (2013.01); *Y02E 10/549* (2013.01)

(56) References Cited

U.S. PATENT DOCUMENTS

| | | |
|---|---|---|
| 8,299,459 B2 | 10/2012 | Okajima et al. |
| 2007/0126348 A1 | 6/2007 | Iou |
| 2008/0111474 A1 | 5/2008 | Sung et al. |
| 2009/0218934 A1 | 9/2009 | Song et al. |
| 2009/0315452 A1 | 12/2009 | Lim et al. |
| 2011/0241029 A1 | 10/2011 | An |
| 2011/0308598 A1 | 12/2011 | Girotto |
| 2012/0018749 A1 | 1/2012 | Lee et al. |

FOREIGN PATENT DOCUMENTS

| | | |
|---|---|---|
| JP | 05-094880 | 4/1993 |
| JP | 2007-242829 A | 9/2007 |
| KR | 10-2004-0040242 | 5/2004 |
| KR | 10-2008-0072531 | 5/2008 |
| WO | WO-90/13148 A1 | 11/1990 |
| WO | WO-95/06400 A1 | 3/1995 |
| WO | WO-99/48160 A1 | 9/1999 |
| WO | WO-00/36662 A1 | 6/2000 |
| WO | WO-2004/068389 A2 | 8/2004 |
| WO | WO-2011/062857 A2 | 5/2011 |
| WO | WO-2011/138621 A1 | 11/2011 |

OTHER PUBLICATIONS

Fehse et al., "Highly-Efficient OLEDs on ITO-Free Polymeric Substrates," Proc. SPIE, 6192:61921Z-1-61921Z-6 (2006).
Harkema et al., "Large Area ITO-Free Flexible White OLEDs with Orgacon PEDOT:PSS and Printed Metal Shunting Lines," *Proc. SPIE*, 7415:74150T-1-74150T-8 (2009).
Leo, "Organic Lighting and Organic Solar Cells," Presentation from Comedd-Opening (2008).
Li et al., "Organic Light-Emitting Materials and Devices," CRC Press (2007). Table of Contents Only.
Osram Datasheet, ORBEOS™ for OLED Lighting, (2009). Retrieved from the Internet: URL:http://www.osramos.com/osram_os/EN/Products/Product_Promotions/OLED_Lighting/Technical_Information/index.html.
Stouwdam et al., "Red, Green, and Blue Quantum Dot LEDs with Solution Processable ZnO Nanocrystal Electron Injection Layers," *J. Mater. Chem., Royal Soc. Chem.*, 18:1889-1894 (2008).
International Preliminary Report on Patentability for Application No. PCT/GB2013/000109, dated Sep. 16, 2014.
International Search Report and Written Opinion for Application No. PCT/GB2013/000109, dated May 24, 2013.
Search Report for Application No. GB1204670.2, dated Jul. 18, 2012.

OPTOELECTRONIC DEVICE

FIELD OF THE INVENTION

The invention generally relates to an optoelectronic device and to a method of fabricating such a device. More specifically, embodiments of the device may, for example, be electroluminescent, such as an organic light emitting diode (OLED) incorporated in a lighting tile, lighting panel, display backlight, or may be photovoltaic.

BACKGROUND TO THE INVENTION

Organic light emitting diodes (OLEDs) are particularly useful for lighting because they can be fabricated relatively simply and at low cost to cover a large area on a variety of substrates. They are also bright and may be coloured (red, green and blue) or white as desired. OLEDs may be fabricated using either polymers or small molecules: examples of polymer-based OLEDs are described in WO 90/13148, WO 95/06400 and WO 99/48160; examples of so-called small molecule based devices are described in U.S. Pat. No. 4,539,507. In this specification references to organic LEDs include organometallic LEDs.

To aid in understanding embodiments of the invention it is helpful to describe an example structure of an OLED device. Thus, referring to FIG. 1a, this shows a vertical cross-section through a portion of an OLED 10 comprising a transparent substrate 12 on which metal, for example copper, tracks 14 are deposited to provide a first electrode connection, in the illustrated example an anode connection. A hole injection layer (HIL) 16 is deposited over the anode electrode tracks, for example a conductive transparent polymer such as PEDOT:PSS (polystyrene-sulphonate-doped polyethylene-dioxythiophene). This is followed by a light emitting polymer (LEP) stack 18, for example comprising a PPV (poly(p-phenylenevinylene)-based material. The hole injection layer helps to match the hole energy levels of the LEP stack to those of the anode metal. This is followed by a cathode stack 20, for example comprising a low work function metal such as calcium or barium for the LEP stack and cathode electrode energy levels matching or comprising an electron injection layer such as lithium fluoride, over which is deposited a reflective back electrode, for example of aluminium or silver.

The OLED example of FIG. 1a is a "bottom emitting" device in which light is emitted through the transparent substrate, made for example of glass or plastic. However a "top emitting" device may also be fabricated in which an upper electrode of the device is substantially transparent, for example fabricated from indium tin oxide (ITO) or a thin layer of cathode metal (say less than 100 nm thick).

Referring now to FIG. 1b this shows a view of the OLED device 10 of FIG. 1a looking towards the LEP stack 18 through the substrate 12, that is looking into the light-emitting face of the device through the "bottom" of the device. This view shows that the anode electrode tracks 14 are, in this example, configured as a hexagonal grid or mesh, in order to avoid obscuring too much light emitted by the LEP stack 18. The (anode) electrode tracks 14 are connected to a solid metal busbar 30 which runs substantially all the way around the perimeter of the device, optionally with one or more openings 32, which may be bridged by an electrical conductor to facilitate a connection to the cathode stack of the device.

FIG. 1c shows a Lighting Panel 100 comprising a plurality of OLEDs 10 having a structure as shown in FIGS. 1a and/or 1b.

Metal tracks, such as the anode tracks 14, are provided in OLEDs such as those of FIGS. 1a-c to increase the conductivity of an electrode and to enable current distribution over a wider area, preferably more uniformly. Thus, the metal tracks 14 preferably have sufficient coverage and conductance to provide a rate and distribution of charge flow that allows the desired amount and uniformity of the luminance of the OLED device. The metal tracks may be placed at intervals of, e.g., tens of µm to a few cm, across the lateral extent of a large area OLED lighting panel. However, deposition of active OLED layers on top of a non-planar surface may result in thickness and/or contour variations, i.e., non-planar surface regions, of the layers. Such variations may for example result in luminance non-uniformities, device instabilities and/or device failure due to electrical shorts (localised regions of higher current densities ('hot spots') for example between the tracks and light emissive layer, or in the light emissive layer) in the device. Edges of the metal tracks may cause such thickness and/or contour variations.

Therefore, metal tracks in Lighting Panels comprising OLEDs are preferably planarised prior to processing of the light-emitting and associated (e.g., charge injection) layers. Infill planarisation of the metal tracks may be provided, for example by depositing photoresist or other, generally electrically insulating, planarization materials over the metal tracks.

The anode electrode of an OLED device as described above may comprise an ITO layer on the substrate for current distribution. Such ITO layer typically has a sheet resistance of, e.g., 20-50 Ohms/sq. Use of ITO as anode material may thus be advantageous for providing an electrically conductive anode. However, the sheet resistance of such ITO layer may not be low enough to provide the desired amount and/or uniformity of the luminance of an OLED device. Moreover, the cost of the ITO material and its deposition process are relatively high and this may be significant in relation to products such as, for example, large area Lighting Panels which may comprise a plurality of OLEDs. In addition, the ITO layer has a refractive index of typically ~1.7-1.9 which is significantly higher than the refractive index (~1.5) of conventional glass or plastic substrates employed in the manufacture of OLEDs. This mismatch in refractive indices between the substrate and the ITO layer can cause optical losses due to light being trapped in waveguided modes.

Similar considerations apply to other optoelectronic devices, e.g., photovoltaic (PV) devices or other electroluminescent devices.

Therefore, there remains a need to provide an optoelectronic device that can be, inter alia, fabricated relatively simply and/or at low cost and/or has improved performance, preferably not comprising ITO. More specifically, the field of optoelectronic devices continues to provide a need for, e.g., greater efficiency (light to electrical energy conversion or vice versa), improved uniformity of light output or absorption and/or energy conversion across the device, improved reliability and/or lifetime (for example reducing or eliminating the occurrence of electrical shorts), lower cost, etc. Such a need exists for example in relation to devices with relatively large dimensions, e.g., an OLED Lighting Panel. For use in understanding the present invention, the following disclosures are referred to:

Large Area ITO-free Flexible White OLEDs with Orgacon PEDOT:PSS and Printed Metal Shunting Lines, Harkema et al., Proc. SPIE, Vol. 7415, 74150T (2009);

Presentation from Comedd-Opening on Oct. 30, 2008, "Organic Lighting and Organic Solar Cells", Prof. Dr. Karl Leo, Fraunhofer IPMS, available from http://www.ipms.fraunhofer.de/common/comedd/presentation/leo.pdf;

Osram Datasheet "ORBEOS™ for OLED Lighting", dated 2009 Nov. 18, available at least from May 18, 2010, from http://www.osram-os.com/osram_os/EN/Products/Product_Promotions/OLED_Lighting/Technical_Information/index.html;

International patent application publication WO2004/068389, Conductive Inkjet Technology Ltd., et al., inventors Hudd et al., published Aug. 12, 2004;

Korean publication KR2008004919, published 2008 May 14, Samsum Electronics Co Ltd.;

Japanese publication JP2007242829, published 2007 Sep. 20, Rohm Co Ltd.;

Japanese publication JP5094880, published 1993 Apr. 16, NEC Corp.;

United States patent application publication US2007/0126348, published Jun. 7, 2007, Iou, and CN1832647, AU Optronics Corp.;

Korean publication KR20040040242, published 2004 May 12, LG Philips LCD Co Ltd.;

International patent application publication WO00/36662, published Jun. 22, 2000, Cambridge Display Technology Ltd.;

Low-cost, large area production of flexible OLEDs a step closer, Press Release Apr. 7, 2009, Agfa Materials and Holst Centre; and Highly-efficient OLEDs on ITO-free polymeric substrates, Fehse et al., Proc. SPIE Vol. 6192, 61921Z, 2006.

For general background information relating to OLEDs, information on device structures and methods of making OLED devices are described in the book "Organic Light-Emitting Materials and Devices", edited by Zhigang Li and Hong Meng, published by CRC Press (Taylor and Francis) in 2007 (ISBN 1-57444-574-X), especially Chapters 2 and 8 for polymer materials and devices.

SUMMARY

According to a first aspect of the present invention, there is provided an optoelectronic device comprising an anode layer, a semiconductive layer provided over the anode layer, and a cathode layer provided over the semiconductive layer, the anode layer comprising a plurality of electrically conductive tracks connected together and spaced apart from one another with gaps therebetween, the device further comprising a first and one or more further hole injection layers provided between the anode layer and the semiconductive layer and extending across said gaps, wherein the first hole injection layer has a conductivity greater than the conductivity of the one or more further hole injection layers.

Generally speaking, a hole injection layer (HIL) composition is suitable when, adjacent to an anode material (e.g., ITO or metal, e.g. copper, gold, silver, aluminium, etc.), it lowers an energy barrier for hole transfer between the anode material and a semiconductive layer (e.g., a light emissive polymer or a light absorbing polymer) provided over the anode material. That is, for an OLED, the HIL composition provides a step-ladder energy barrier for hole injection from the anode material into the semiconductive layer. A HIL composition is also suitable when its work function is matched, i.e., substantially similar, to that of the anode material. Therefore, in an embodiment wherein at least one of the HILs comprises an organic material, e.g., un-doped polymer, a lowering of the energy barrier is achieved by using anode material with a large work function which is more closely aligned with the HOMO level of the HIL. However, in another embodiment wherein at least one of the HILs adjacent to the anode material comprises a high conductivity material (as would be the case for a doped polymer), a choice of the HIL material with regards to its work function may not be necessary. Thus, in an embodiment, preferably at least the HIL closest to the anode layer lowers or matches the energy barrier for hole injection from the anode layer, e.g., the tracks, while the other HILs would preferably be suitable to provide such a lowered or matched energy barrier if in contact with the anode layer. Preferably, the other HILs have HOMO levels substantially aligned to (or above) the HOMO level of the HIL closest to the anode layer. When considered in combination, the plurality of HILs may therefore together improve efficiency of hole injection from the anode layer toward the semiconductive layer compared to an arrangement omitting a HIL. The composition of at least the HIL closest to the anode layer, e.g., the first HIL, and each of the one or more further HILs may comprise a p-doped material.

Advantageously, the plurality of HILs may allow an optical cavity optimised for enhanced light out-coupling and/or more uniform light emission in an electroluminescent device. Similarly, the plurality of HILs may advantageously allow an optical cavity optimised for enhanced light in-coupling and/or more uniform light absorption in a photovoltaic device.

There may further be provided an optoelectronic device in which the semiconductive layer is electroluminescent and the device is a light emissive device. For example, the device may be an OLED device comprising a dual (or more) HIL structure on top of (preferably metal) anode tracks, preferably for an ITO-free OLED device. In an embodiment, the first HIL may be optimised for high lateral conduction between the anode tracks and the other, optionally thicker, HIL(s) is(are) preferably optimised for hole-supply for luminescence of the LEP, specifically for more stable hole-supply during driving of the LEP, electrical response to shorts and/or for optical properties for enhanced light out-coupling. The presence of the higher conductivity HIL preferably enables a larger aperture ratio for an OLED device with anode tracks. Either or both (or more) HILs may further provide improved coating quality (thus advantageously reducing the potential for shorts and/or enable higher device yields). An inter-layer may also be deposited between the HILs to prevent inter-mixing, but preferably has a low interaction with the HIL materials.

There may further be provided an optoelectronic device in which the semiconductive layer is photoconductive and the device is a photovoltaic (PV) device. For example, the device may be a PV device comprising a dual (or more) HIL structure on top of (preferably metal) tracks, preferably for an ITO-free PV device. In an embodiment, the first HIL may be optimised for high lateral conduction between tracks and the other, optionally thicker, HIL(s) is(are) preferably optimised for hole-transport in relation to photoabsorption of the PV device, for electrical response to shorts and/or for optical properties for enhanced light coupling into the PV layer. The presence of the higher conductivity HIL preferably enables a larger aperture ratio for a PV device with tracks. Either or both (or more) HILs may further provide improved coating quality (thus advantageously reducing the potential for shorts and/or enable higher device yields). An inter-layer may also be deposited between the HILs to prevent intermixing, but preferably has a low interaction with the HIL materials.

There may further be provided an optoelectronic device in which the one or more further HILs has an optical extinction coefficient k smaller than the optical extinction coefficient of the first HIL in a predetermined wavelength range. Such an extinction coefficient may be considered as the imaginary part of the complex refraction index and indicates the amount of absorption loss when light propagates through a HIL. Thus, the HIL having higher electrical conductivity may inherently have greater light absorption, i.e., be less transmissive, due to the higher free carrier density. Preferably, the one or more further HIL has an optical extinction coefficient k less than 0.03 and or more preferably less than 0.01.

There may further be provided an optoelectronic device in which the semiconductive layer comprises an organic semiconductor. Such an optoelectronic device may be an OLED device for example as described above.

There may further be provided an optoelectronic device, being carried by an electrically insulative light transmissive substrate. For example, such a substrate may comprise glass or plastic. The anode may be in direct contact with said substrate. Such an anode may comprise metal tracks or an ITO layer, however, such an ITO layer is preferably not present in embodiments.

There may further be provided an optoelectronic device in which the first HIL is provided between the anode layer and the one or more further HILs. Thus, a lower conductivity HIL is closer to the semiconducting layer. This may advantageously mitigate the effects of gaps, e.g., pinholes, present within the semiconducting layer by providing higher electrical resistance at localised regions of higher conductivity in the semiconducting, e.g. light emission, layer. Thus, device reliability and/or yield may be enhanced. There may also be provided an optoelectronic device in which the one or more further HILs is provided between the anode layer and the first HIL.

There may further be provided an optoelectronic device in which the first HIL is adjacent the substrate and has a refractive index which is greater than or equal to or substantially matched to the refractive index of the substrate. The higher conductivity HIL may thus increase conduction between tracks of the anode without significantly impairing device light coupling.

There may further be provided an optoelectronic device in which the one or more further HILs has a refractive index which is greater than or equal to or substantially matched to the refractive index of the substrate. Preferably, each of the HILs, and more preferably all layers of the device, are substantially index-matched to the substrate to enhance light coupling and thus optoelectronic efficiency of the device.

There may further be provided an optoelectronic device in which a further layer comprising a hole transport material is provided between the HILs and the semiconductive layer. Such a layer may be referred to as a hole transport layer (HTL). The HTL may have higher hole mobility than electron mobility to increase hole supply to the semiconductive layer, preferably to improve the balance of electron and holes in the semiconductive layer, during operation of the device, thus advantageously improving the optoelectronic efficiency of the device. The hole transport material may be undoped.

There may further be provided an optoelectronic device in which the first and/or the one or more further HILs are p-doped. The doping concentrations of the HILs may be selected to improve the above alignment of hole energy levels of the semiconductive layer to the hole energy levels of the anode to preferably improve efficiency of hole injection from the anode, thus improving hole transfer between anode and semiconductive layer, and to provide the greater conductivity of the first HIL. Preferably, the first HIL has a conductivity greater than 1 S/cm, preferably greater than 2 S/cm, more preferably greater than 5 S/cm or 10 S/cm. In an embodiment, the conductivity of the first HIL may be greater than that of the second HIL by a factor of, e.g., 2, 10 or 100.

There may further be provided an optoelectronic device in which the first and/or the one or more further HILs comprise conductive polymers. Preferably, any one or more of the HILs may comprise a PEDOT-based composition. In more detail, the polymer of any one or more of the HILs may be selected from the group consisting of: PEDOT:PSS, poly(acetylene)s, poly(pyrrole)s, poly(thiophene)s, poly(aniline)s, poly(fluorene)s, poly(3-alkylthiophene)s, poly(3,4-thylenedioxythiophene), polytetrathiafulvalenes, polynaphthalenes, polyparaphylene, poly(paraphenylene sulphide), or poly(praphenylene vinylene).

There may further be provided an optoelectronic device in which at least one of the first and the one or more further HILs is adapted to provide planarisation of the underlying topography. For example, the HIL closest to the tracks may provide a conformal coating over the tracks while the HIL further from the tracks provides a substantially planar surface, or both of the first and the one or more further HILs may provide a substantially planar surface over the tracks. Thus, advantageously, an electrically resistive layer, e.g., photoresist, may not be needed for infill planarisation of the tracks to improve, e.g., uniformity of luminance over the device. In this regard, it is noted that the first HIL may be closer to the tracks than the second HIL, or vice versa.

According to a second aspect of the present invention, there is provided a method of fabricating an optoelectronic device, comprising providing an anode layer on a substrate, the anode layer comprising a plurality of electrically conductive tracks connected together and spaced apart from one another with gaps therebetween, depositing a first hole injection layer from a first solution and one or more further hole injection layers from one or more further solutions over the anode layer and extending across said gaps, depositing a semiconductive layer over the first and the one or more further hole injection layers, and depositing a cathode layer over the semiconductive layer, characterised in that the first hole injection layer has a conductivity greater than the conductivity of the one or more further hole injection layers.

There may further be provided a method in which one of the first solution and the one or more further solutions has a viscosity greater that the other of the first solution and the one or more further solutions.

There may further be provided a method in which one of the first and the one or more further hole injection layers comprises a cross-linkable polymer which is cross-linked prior to deposition of the other of the first and the one or more further hole injection layers. For example, the first HIL may comprise a cross-linkable polymer which is cross-linked prior to deposition of a further HIL.

There may further be provided a method in which the solvent used in the first solution is different from the solvents used in the one or more further solutions, and the solvents used in the one or more further solutions are selected such that they do not dissolve the first HIL to an appreciable extent during deposition.

Preferred embodiments are defined in the appended dependent claims.

The above aspects, with or without any one or more of the optional features of the preferred embodiments as defined in the dependent claims, may be combined in any permutation.

BRIEF DESCRIPTION OF THE DRAWINGS

For a better understanding of the invention and to show how the same may be carried into effect, reference will now be made, by way of example, to the accompanying drawings, in which.

DETAILED DESCRIPTION OF PREFERRED EMBODIMENTS

Embodiments are generally described as optoelectronic devices or methods of fabricating such devices. Merely by way of example, the following refers in the most part to electroluminescent devices, specifically organic light emitting diodes (OLEDs) devices such as a discrete OLED, OLED lighting tile or OLED lighting panel. Nevertheless, it will be apparent to the skilled person that features described below in relation to such devices are similarly applicable to photovoltaic device embodiments.

Figure 2:
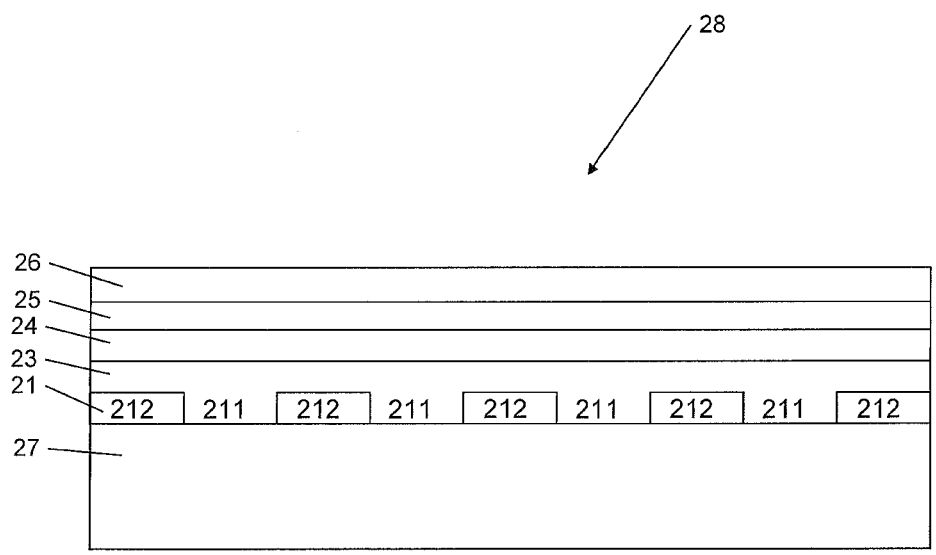
FIG. 2 shows an optoelectronic device according to an embodiment.

FIG. 2 shows an optoelectronic device 28, preferably a bottom-emissive electroluminescent device, comprising anode layer 21 having metal (e.g. comprising copper, gold, silver, aluminium, etc., optionally ink-jet printed, screen printed, electro- or electroless-plated or evaporated) tracks 212 and gaps 211, a plurality of hole injection layers (HILs) comprising a first HIL 23 and a second HIL 24, a semiconductive layer 25, e.g., light emitting polymer (LEP), a cathode layer 26 and a substrate (e.g., glass) 27. Either one of the HILs 23, 24 has a higher electrical conductivity than the other.

The semiconductive layer 25 may comprise an electroluminescent layer such as a light emitting polymer layer, e.g., in the case that the device 28 is an OLED device. Where the device is a photovoltaic (PV) device, the semiconductive layer 25 comprises a photoconductive layer, e.g., may comprise a light absorbing polymer layer. In either case, there may be present more than one semiconductive layer (not shown), for example to provide a heterojunction between n- and p-doped semiconductive layers in a PV device.

Additionally or alternatively, there may be present one or more other layers and/or features, e.g., a busbar (e.g. copper) which runs substantially all the way around the perimeter of the device, optionally with one or more openings, which may be bridged by an electrical conductor, to facilitate connection to the anode or cathode layer. A charge transport layer(s) may be present between the first and/or second HILs 23, 24 and semiconductive layer 25 (in this case, a HTL: hole transporting layer or an IL: inter-layer) and/or between the cathode layer 26 and semiconductive layer 25 (in this case, an ETL: electron transporting layer or an EIL: electron injection layer) for balancing supply of electrons and holes to the semiconductive layer. Moreover, there may be present in any embodiment more than two HILs, e.g., one or more HILs in addition to layers 23 and 24.

Figure 1A:
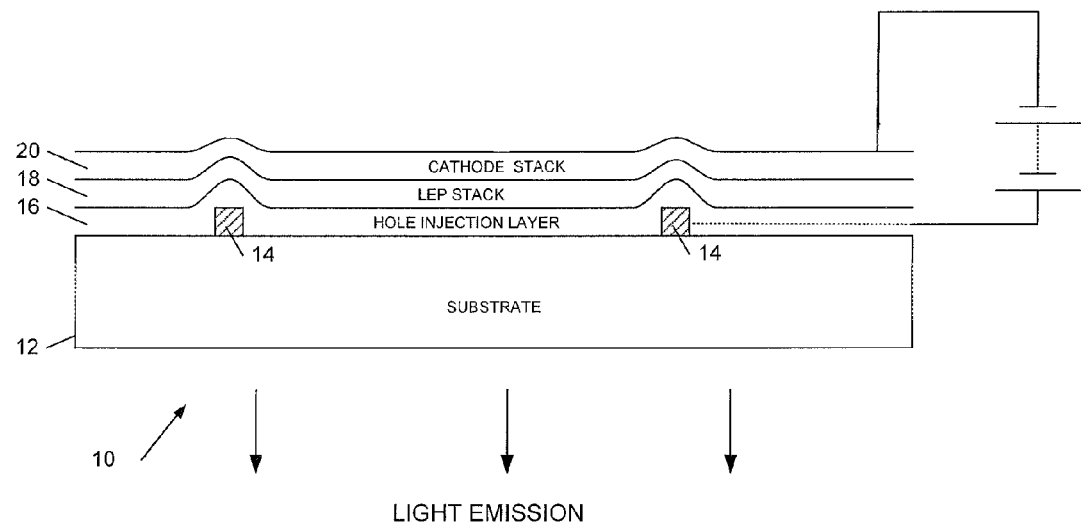
FIG. 1a shows a vertical cross-section through a portion of an OLED device 10.
Figure 1B:
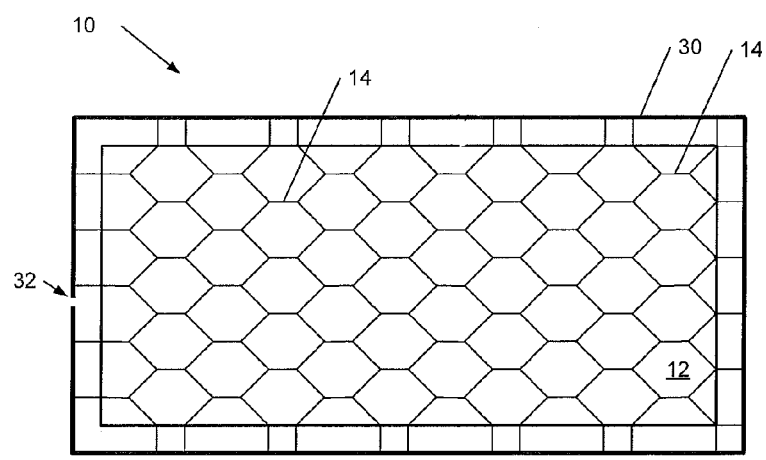
FIG. 1b shows a view of an OLED device 10 of FIG. 1a looking towards the LEP stack through the substrate, that is looking into the light-emitting face of the device through the 'bottom' of the device.
Figure 1C:
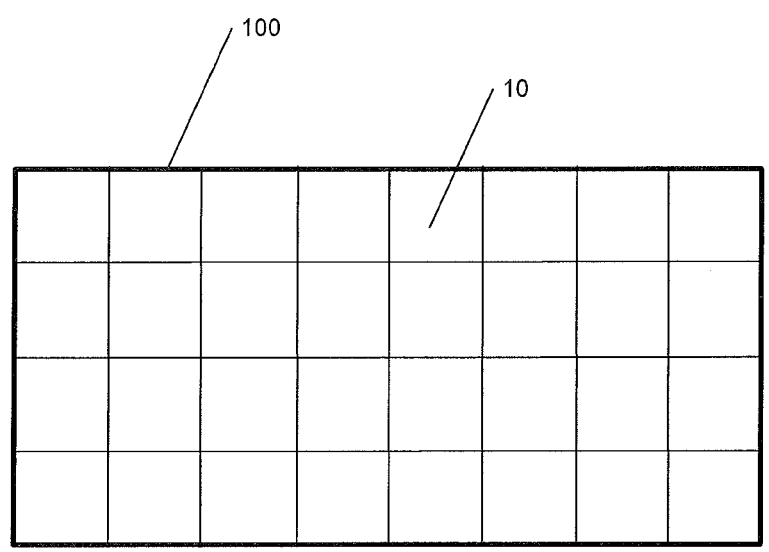
FIG. 1c shows a Lighting Panel 100 comprising a plurality of OLEDs 10 having a structure as shown in FIGS. 1a and/or 1b.

The plurality (>2) of HILs may be more advantageous, for example for improved uniformity of luminance, when applied over a large area or over the gaps between the anode tracks. For example, an OLED lighting tile may have at least one dimension (e.g., diameter or edge length) of the order of, e.g., up to ~10 cm, preferably ~1 cm-~5 cm. Moreover, an OLED lighting panel may have such dimension(s) of the order of, e.g., up to ~100 cm, preferably ~5 cm-~20 cm. Such a tile or panel may be flat or curved, and/or of any desired shape, preferably rectangular, such a panel for example having a plan view as shown in FIG. 1c. Generally, the OLED device embodiments described herein are fabricated using polymers. However, alternative embodiments may be small molecule OLED devices.

Figure 3:
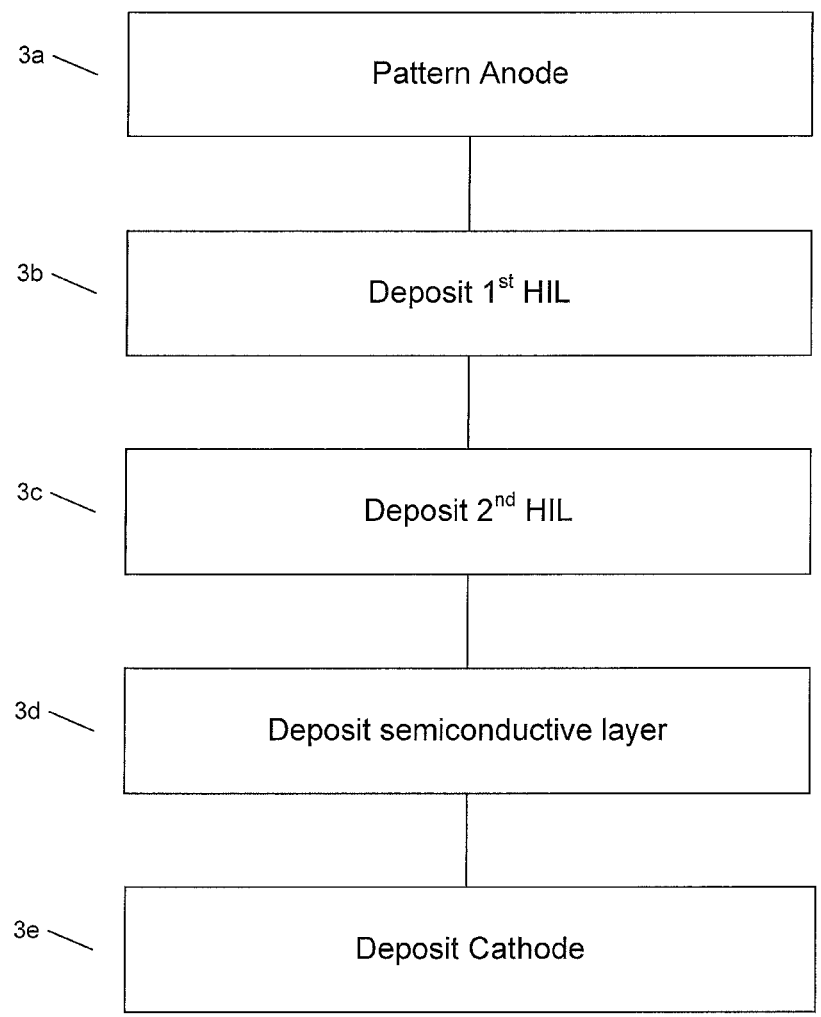
FIG. 3 shows a flowchart of a method of fabricating an optoelectronic device according to an embodiment.

FIG. 3 shows a method for fabricating an optoelectronic device. Thus, the deposited layers (anode, first HIL, second HIL, semiconductive layer, cathode) of FIG. 3 preferably correspond respectively to the layers of FIG. 2 (21, 23, 24, 25, 26). Step 3a comprises providing a patterned anode on a substrate, for example an anode comprising (preferably metal) tracks on a substrate, e.g., glass. Step 3b comprises depositing a first HIL from a first solution over the patterned anode, e.g., by spin coating. Step 3c comprises depositing, e.g., by spin coating. a second HIL from a second solution over the first HIL, for example after hardening (e.g., by baking) the first HIL. Step 3d comprises depositing a semiconductive layer (e.g., a light emitting polymer or a light absorbing polymer) over the second HIL. Step 3e comprises depositing a cathode over the semiconductive layer. The first HIL has a conductivity greater than the second HIL, or vice versa. There may be any number of further, intermediate processing steps, for example for deposition of additional layers.

With further reference to FIG. 2, the first and second HILs 23, 24 are disposed over the anode tracks (preferably directly in contact with the tracks) and below the LEP layer 25. Each of HILs 23, 24 preferably comprises a conductive organic, e.g., polymer, layer (conductive throughout this specification relating to electrical conduction). The first and/or second HILs, for example when either or both comprise a polymer, may be p-doped according to a desired conductivity(s). The first HIL 23 preferably has higher conductivity than the second HIL 24 and may effectively form part of the anode, for example if placed directly on the tracks or at least between the second HIL 24 and the tracks. However, the first and second HILs 23, 24 are interchangeable in positional order within the device. In an alternative arrangement, a network of nanowires may be deposited as the HIL having greater conductivity or as a further HIL in addition to the first and second HILs 23, 24.

The device 28 may further comprise a hole transporting layer (HTL), which is located for example between the HILs 23,24 and the semiconductive layer (e.g., LEP) 25. The HTL may have higher hole mobility than electron mobility. Additionally or alternatively to the HTL, the device may comprise an electron transporting layer (ETL), which is located between the semiconductive layer 25 and the cathode 26. The ETL may have higher electron mobility than hole mobility.

Preferably, the first and/or second HIL 23, 24 are index matched to the substrate 27, i.e., have substantially (substantially including exactly throughout this specification) the same refractive index as the substrate. For example, the first and/or second HIL may comprise a polymer such as a PEDOT (poly(3,4-ethylenedioxythiophene)) based composition (e.g., PEDOT:PSS-Poly(3,4-ethylenedioxythiophene) poly(styrenesulfonate)) that is index matched to a glass substrate having a refractive index e.g., ~1.5 at a visible wavelength. Thus, the refractive index of the first and/or second HIL is preferably within a range of 1.49-1.6, more preferably at least close to 1.5. The optical extinction coefficient k of the first and/or second HIL is preferably substantially zero, e.g., less than or equal to about 0.1, more preferably less than or equal to about 0.01, yet more preferably less than or equal to 0.001, e.g., ?0.0001, at a predetermined visible wavelength (visible wavelengths covering the range of 380 nm to 750 nm). Regarding conductivity of the HIL(s) having such a PEDOT based composition, we note that a PEDOT layer may have conductivity of, e.g., ~0.001-1000 S/cm, and this may be varied by doping. Preferably, the HIL having the greater conductivity, e.g., HIL 23 in FIG. 2, has a conductivity of greater than 1 S/cm.

The conductivity of the more conductive HIL (in this embodiment, HIL 23) is preferably at least lateral conductivity, lateral being in a plane parallel to the plane of the tracks (this generally being parallel to the upper surface of the substrate; "parallel" in a non-planar device may mean contoured to match a plane of, i.e., remain substantially equidistant from, the tracks, for example in the context of a curved device). Thus, the anode may be considered as comprising at least the HIL with the greater conductivity, which may therefore advantageously allow an ITO layer to be omitted from the anode in an embodiment. Optical loss may be reduced in an embodiment compared to a device having an anode comprising ITO, for example if at least the HIL having greater conductivity nevertheless has sufficient transparency and a refractive index appropriate for light out-coupling and for minimising optical losses due to light trapped in waveguided modes The composition of the first and/or second HIL 23, 24 may be selected to reduce the occurrence of electrical shorts. For example, if the LEP thickness is non-uniform, e.g., too thin in certain regions, such that charge flow to/from the HIL from above the LEP, e.g., to/from the cathode 26, may bypass the LEP, such charge flow may be reduced by providing the relatively low conductivity second HIL between the LEP and higher conductivity first HIL. This may advantageously reduce the occurrence of hot spots that would otherwise lead to shorter device/panel lifetime. In such an embodiment, the second HIL may advantageously comprise a high resistance PEDOT or other polymer composition.

Preferably, the lateral conductivity of the HIL having greater conductivity (in this embodiment HIL 23) is greater than 1 S/cm, more preferably greater than 10 S/cm, and still more preferably greater than 100 S/cm. However, a highly conductive HIL (e.g., having conductivity of more than ~103 S/cm, albeit less than a typical conductivity of metal (e.g., up to ~107 S/cm ~)) may absorb more light than desired and therefore a HIL of intermediate conductivity is preferably provided as the first HIL 23 in combination with metal tracks to allow sufficiently high charge current flow to the semiconductive layer 25. Thus, while the first HIL 23 with higher conductivity may in an embodiment effectively replace an ITO layer as discussed above, the anode nevertheless preferably retains metal track 212. Generally, the higher the conductivity of the first HIL 23, the less tracks may be required and thus the lower the light loss due to the tracks. The optimum lateral conductivity of the first HIL may depend on the particular conductance of the tracks in an embodiment. The conductivity of a polymer HIL may be determined by a doping concentration, e.g., of p-type dopant.

The tracks preferably have sufficient coverage and thickness to provide a sufficient rate of charge flow through the plurality of HILs, and thus to the semiconductive layer 25 to allow the desired luminance. The rate of charge would also be dependent on the efficiency of the LEP and the specific OLED device structure. The tracks may comprise a fine lattice or grid of tracks across the substrate where light in-coupling, i.e., transparency, is required, and/or different track spacing where the tracks are optimised for an electrical contact region, e.g., comprising a busbar, at the edge of the device or lighting panel (relative to spacing beyond such an electrical contact region). The actual thickness of the tracks may depend on the composition of the tracks, e.g., screen printed silver paste may have relatively low conductivity and thus require a greater thickness than, e.g., evaporated metal tracks.

A minimum thickness of material may be preferred over the tracks to provide a desired uniformity of luminance (or absorption in a PV device) across the semiconductive layer 25, which may be considered as the optically active layer. Since, as indicated above, a polymer having higher conductivity is generally also a stronger light absorber, achieving such thickness solely by increasing the thickness of a single polymer HIL in a device may compromise the optical performance of the device. In the present embodiment, however, the first and second HILs 23, 24 may together provide sufficient thickness. Thus, the embodiment may be considered as relating to infill planarisation of the tracks. For example, either one of these HILs may provide a conformal layer (i.e., generally following the topography of the tracks, but smoothing out the sharp edges) over the tracks, while the other HIL may provide a flat surface over the undulating conformal layer. Table 1 below shows step height thicknesses measured with a Zygo optical interferometer for a 65 nm (first) high-conductivity hc-HIL which was spin-coated over ITO-free tracks and a 75 nm (second) standard s-HIL which was spin-coated over the hc-HIL. As it can be seen, the application of the standard s-HIL leads to increased planarization of the topology of the tracks.

TABLE 1

| Step height tracks (nm) | Step height after hc-HIL coating (nm) | Step height after s-HIL coating (nm) |
|---|---|---|
| 69 | 66 | 52 |
| 100% | 96% | 75% |

Further in this regard, an advantage of the multilayer structure formed by the plurality of HILs, wherein at least one of these HILs is used for planarisation (conformal and/or to provide a flat surface as described above), is that a HIL of the structure may be provided directly on the tracks, e.g., without an insulating layer (e.g., photoresist as described above) for planarisation. Such an embodiment has simpler construction than one additionally having such an insulating layer and therefore may be manufacturable relatively simply and/or at low cost.

The multi-HIL structure may additionally or alternatively be advantageous regarding lifetime of the device. The HIL of a standard OLED device typically has a significant impact on the device lifetime, some HIL compositions being better for device lifetime than others. For example, operation of an OLED device may have the unintended side-effect of electrons being injected into the HIL; this may result in the HIL becoming more insulating and thus leading to voltage rise across the HIL. Additionally or alternatively regions of high current density or 'hot spots' (due to current flow in a HIL or semiconductive layer) may reduce the lifetime of the device. In the present embodiment, for example, the composition of one of the HILs may be selected for the greater lateral conductivity, while the other HIL may be optimised for hole supply and longer device lifetime with either HIL additionally designed for improved light transmission.

The deposition of the plurality of HILs may result in some intermixing of the compositions of adjacent HILs, e.g., by dissolution. For example, this may be the case where the first and/or second HIL is deposited from solution, e.g., polymer in solvent, and further by way of example where the deposition comprises spinning a composition of an upper HIL (e.g., second HIL) onto a lower HIL. Thus, the HIL deposition process is preferably adapted to prevent the intermixing of the HIL compositions by keeping the HIL compositions substantially distinct from one another. Preventing the intermixing is achieved by employing orthogonal solvents for the solutions of the HIL compositions (orthogonality in this context generally meaning that solvent of one HIL cannot dissolve material in an adjacent HIL layer during deposition). Such orthogonality may be achieved for example by a selection of different solvents of the layers, e.g., one of the layers may comprise a polar, e.g. water-based, solvent while the other may comprise a non-polar, e.g. organic solvent. Additionally or alternatively, at least the lower (i.e., first deposited) HIL may be provided as a cross-linked polymer composition, e.g., by UV illumination or thermal curing of a polymer HIL, so that it is substantially insoluble during deposition of an upper HIL solution. Additionally or alternatively, an interlayer may be provided between adjacent HILs to reduce intermixing. Such an interlayer may comprise an electrically insulating composition and/or may be thin enough to allow tunnelling of charge between the layers through the interlayer. Such an interlayer may additionally or alternatively be advantageous for alining the HOMO and/or LUMO levels of the two HILs, where the two HILs each comprise polymers. However, even where the compositions of adjacent HILs are water-soluble, intermixing may be limited, for example where at least one of the HILs comprises for example a PEDOT-based composition that mixes less readily than the composition of the other HIL.

In view of the above, advantages of using the plurality of HILs may include, inter alia, reduced cost, improved optical performance (e.g., improved transmissivity allows more light to be emitted through the bottom of the device 28 of FIG. 2) and/or improved reliability (e.g., due to reduced occurrence of electrical shorts). Such advantage(s) may in an embodiment arise in connection with omission of ITO from the anode.

In summary, an embodiment may be considered of an OLED device comprising a dual (or more) HIL structure on top of metal tracks, and is preferably an ITO-free OLED device. A first HIL is preferably optimised for high lateral conduction and may thus enable a larger aperture ratio for anode tracks comprising the HIL. The other, optionally thicker, HIL is preferably optimised for hole-supply for luminescence of the LEP, electrical response to shorts, and/or for optical properties for enhanced light out-coupling, and may further provide improved coating quality (thus advantageously reducing the potential for shorts). Thus the plurality of HILs allows the flexibility to tune the optical cavity of the OLED device for enhanced light out-coupling and/or more uniform light emission (as shown in FIG. 4b). The plurality of HILs is preferably selected for, inter alia, improved coating quality, to reduce the potential for shorts and/or enable higher device yields. A thin (<20 nm) interlayer may also be deposited between the HILs to prevent intermixing of the HIL materials, but preferably has a low interaction with the HIL materials.

Such OLED device embodiments may be more advantageous than an ITO-free OLED device that merely integrates a high conductivity polymer anode (e.g., PEDOT:PSS) with metal tracks to support lateral current conduction across a large area panel. Generally speaking, high conductivity polymers are inherently strongly light absorbing in the visible spectrum and therefore limit optical out-coupling, particularly if thicker layers are required to provide sufficient coverage over the surface roughness and topography of the anode metal tracks.

More advantageously, an ITO-free OLED device embodiment employs a multiple, e.g., at least dual, HIL design suitable for a large area panel. The structure incorporates metal tracks which could be formed by a number of techniques including electroless-plating (whereby a precursor material is defined photolithographically or by ink-jet deposition or other printing techniques), by direct ink-jet deposition of a conductive ink or by standard metal deposition and photolithography etching techniques.

Figure 4A:
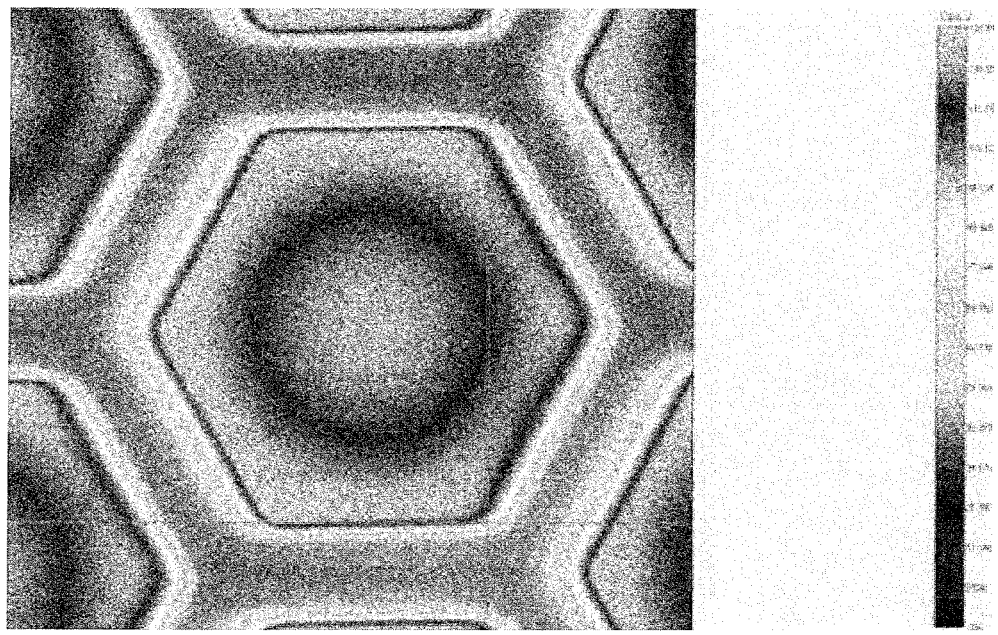
FIG. 4a shows luminance measurements from an ITO-free embodiment comprising 150 nm high conductivity (approx. 400 S/cm) hc-HIL.
Figure 4B:
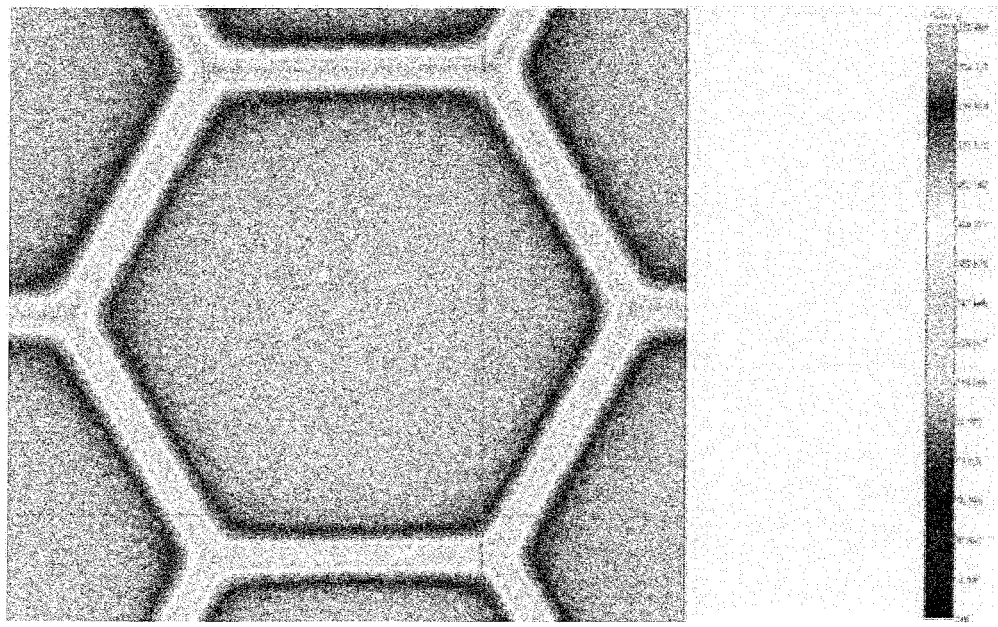
FIG. 4b shows luminance measurements from an ITO-free embodiment comprising 50 nm high conductivity (approx. 400 S/cm) hc-HIL and 50 nm of standard s-HIL (of higher resistivity than the hc-HIL) designed for good hole injection into the device.

FIG. 4a demonstrates the luminance within an anode cell formed by metal tracks in an OLED device where the ITO anode has been replaced with a thick (150 nm) high conductivity HIL (a hc-HIL of PEDOT). Generally, the non-uniformity in the emission is due to variations in the coating thickness of the HIL or the LEP layer or subsequent device layers, resulting in an effective decrease in aperture ratio and a less efficient device. However, this effect may be alleviated by adopting a thinner primary HIL of high lateral conductivity within the anode cell (larger aperture ratio) together with the deposition of a second HIL. The second HIL provides good coverage of the metal tracks' topography and improved planarisation of the surface for subsequent device layers, reducing the potential for shorts and/or allowing more uniform emission characteristics (FIG. 4b). In addition, the second HIL is preferably selected for optimum hole supply, thus improving the device lifetime. The electrical characteristics of the second HIL may also be designed for improved response to shorts by limiting the current that the short can support.

In FIGS. 4a and 4b, the cell size is 240 μm pitch with 10 μm track. The non-uniformity of emission in FIG. 4a is generally due to non-uniform coating of the anode tracks by the HIL, LEP layer or subsequent device layers and possibly additionally due to absorption of the thicker HIL regions, particularly the higher conductivity HIL.

Figure 6:
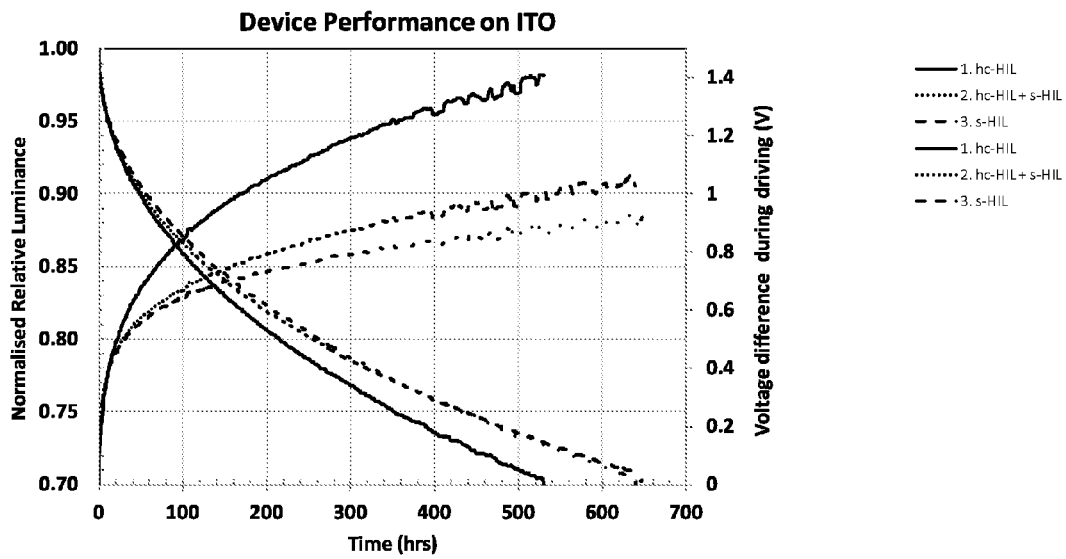
FIG. 6 shows lifetime measurements (normalised relative luminance versus time) and corresponding voltage rise during driving of the OLED device from an ITO embodiment comprising (1) 170 nm high conductivity hc-HIL, (2) 120 nm high conductivity hc-HIL and 50 nm standard s-HIL and (3) 170 nm standard s-HIL.

FIG. 6 demonstrates the lifetime (i.e., the normalised relative luminance versus time) and the corresponding voltage rise during driving of the OLED device in an OLED device with an ITO anode covered with (1) 170 nm high conductivity hc-HIL, (2) 120 nm high conductivity hc-HIL and 50 nm standard s-HIL and (3) 170 nm standard s-HIL. For these measurements, the OLED device was driven from an initial luminance of 1000 Cd/m2. The data shows that the lifetime and the voltage rise have been improved (i.e, the lifetime has increased and the voltage rise has decreased) for the bi-layer HIL device compared to the device comprising only the high-conductivity hc-HIL.

Figure 7:
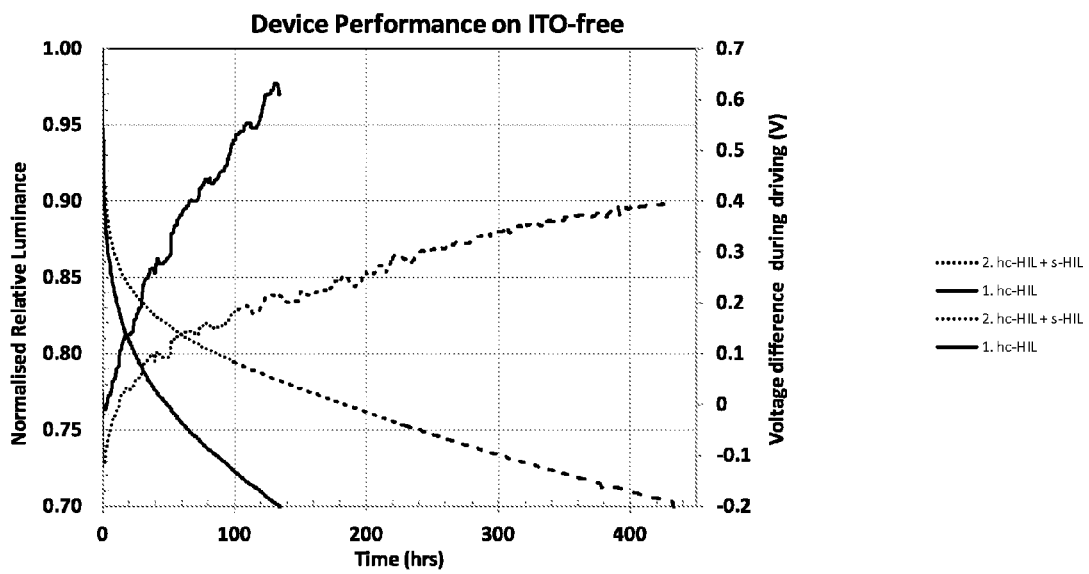
FIG. 7 shows lifetime measurements (normalised relative luminance versus time) and corresponding voltage rise during driving of the OLED device from an ITO-free embodiment comprising (1) 300 nm high conductivity hc-HIL and (2) 150 nm high conductivity hc-HIL and 150 nm standard s-HIL.

FIG. 7 demonstrates the lifetime (i.e., the normalised relative luminance versus time) and the corresponding voltage rise during driving of the OLED device in an OLED device with an ITO-free anode (Au metal track) covered with (1) 300 nm high conductivity hc-HIL and (2) 150 nm high conductivity hc-HIL and 150 nm standard s-HIL. For these measurements, the OLED device was driven from an initial luminance of 1000 Cd/m$^2$. The data shows that the lifetime and the voltage rise have been improved (i.e, the lifetime has increased considerably and the voltage rise has drastically decreased) for the bi-layer HIL device compared to the device comprising only the high-conductivity hc-HIL.

In an alternative arrangement, light absorption within the device may be reduced by merely adopting a single thinner high conductivity HIL. However, this could result in poor planarisation and/or poor coverage of surface roughness and topography of anode metal tracks, leading to increased occurrence of shorts, non-uniformity in emission and/or a non-optimum cavity in terms of optical out-coupling. An embodiment of the present invention may provide improvement in any one or more of these respects relative to a standard device and/or relative to such a device adopting the above single thinner high conductivity HIL. Additionally or alternatively, an embodiment may advantageously provide an ITO-free device substantially without degrading device performance in relation to any one of more of these respects.

In order to achieve a high efficiency OLED device, light which would normally be lost due to total internal reflection at the substrate/air exit interface is preferably out-coupled via an external scatterer, e.g., microlens array on an optical film. This optical out-coupling technique is more efficient when: (i) the optical cavity is tuned such that the amount of light in the substrate is maximised; (ii) losses due to waveguided modes are eliminated; and/or (iii) the device stack presents high reflectivity (low absorption) to allow for light which fails to exit into air on first pass to have multiple opportunities for reflections and out-couple of the device i.e. allows the process of photon re-cycling to occur.

Figure 5:
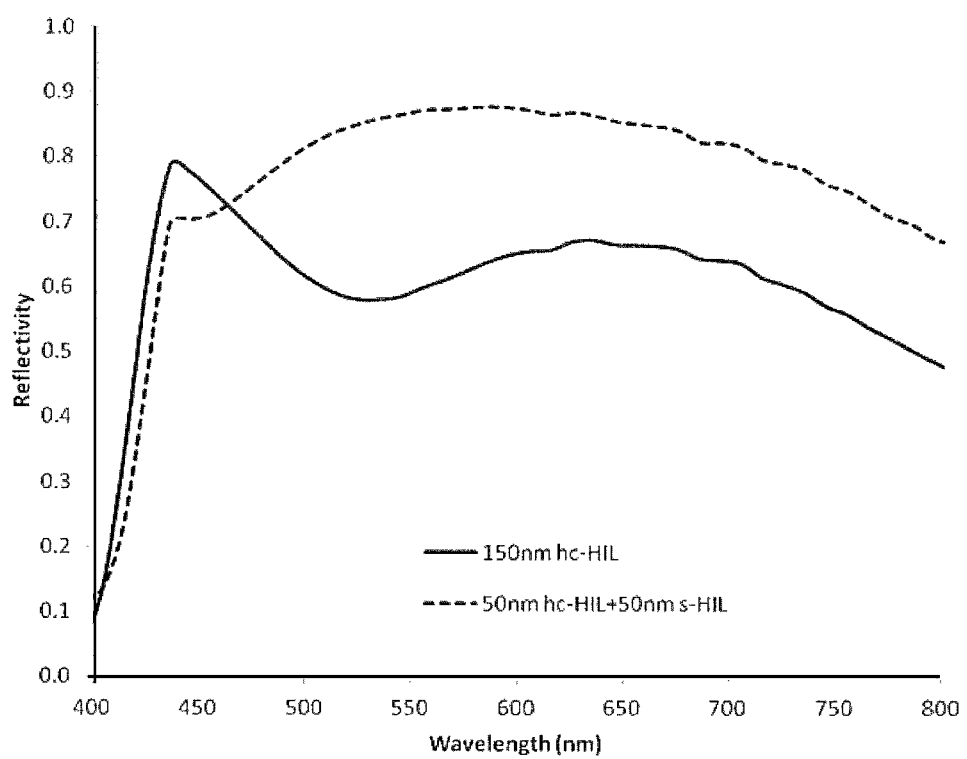
FIG. 5 shows reflectivity versus wavelength measurements for the OLEDs of FIGS. 4a and 4b wherein, with reference to the relative positions of the curves at 650 nm from upper to lower, the HIL(s) comprise: (i) 150 nm hc-HIL (lower curve); and (ii) 50 nm hc-HIL and 50 nm s-HIL (upper curve).

To fulfill the above requirements (i)-(iii), flexibility in the design of HIL thickness, refractive index and absorption characteristics is generally advantageous. With a single high conductivity HIL device it may be difficult to achieve the preferred reflectivities (~70%) for efficient photon re-cycling for light out-coupling with the HIL thickness necessary for good coverage of the metal tracks. However, this can in embodiments be mitigated by a combination of a thinner high conductivity HIL with a first HIL which is of lower absorbing material and appropriate refractive index (FIG. 5).

Changes in the coating/deposition process and HIL bake conditions may improve film quality and/or interface, which in turn may improve the device reflectivities that can be achieved and/or luminance uniformity. Such changes may include for example raising the bake temperature of the primary HIL to produce a film more resilient to solvents from the first HIL (whilst maintaining sufficient lateral HIL conductivity to limit luminance drop within the metal tracks). Additionally or alternatively, the formulation of HILs may be designed with appropriate water/solvent or solid/PSS/polymer content to reduce intermixing between the first and second HILs.

An interlayer material chosen for its low solubility/interaction with the adjacent HIL materials may also be deposited between the primary and secondary HIL to prevent intermixing between HILs. The interlayer material is chosen to be thin (e.g. <20 nm) to limit influence on the optical cavity and of a material with electrical characteristics selected for response to shorts and/or efficient charge injection.

In any one or more of the embodiments described above, any one or more, preferably all, of the HILs, e.g. the first and/or the one or more further HILs 23, 24 of FIG. 2, may comprise p-doped polymer and/or may be deposited from a solution. Preferably at least one of the layers has significant lateral conductivity.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. An optoelectronic device comprising an anode layer, a semiconductive layer provided over the anode layer, and a cathode layer provided over the semiconductive layer, the anode layer comprising a plurality of electrically conductive tracks connected together and spaced apart from one another with gaps therebetween, the device further comprising a first and one or more further hole injection layers provided between the anode layer and the semiconductive layer and extending across said gaps, wherein the first hole injection layer is provided between the anode layer and the one or more further hole injection layers, the first hole injection layer has a conductivity greater than 1 S/cm, and the first hole injection layer has a conductivity greater than the conductivity of the one or more further hole injection layers.

2. An optoelectronic device as claimed in claim 1 in which the semiconductive layer is electroluminescent and the device is a light emissive device.

3. An optoelectronic device as claimed in claim 2 in which the one or more further hole injection layers has an optical extinction coefficient smaller than the optical extinction coefficient of the first hole injection layer in a predetermined wavelength range.

4. An optoelectronic device as claimed in claim 3 in which the one or more further hole injection layers has an optical extinction coefficient k less than 0.03.

5. An optoelectronic device as claimed in claim 1 in which the semiconductive layer is photoconductive and the device is a photovoltaic device.

6. An optoelectronic device as claimed in claim 1 in which the semiconductive layer comprises an organic semiconductor.

7. An optoelectronic device as claimed in claim 1, said device being carried by an electrically insulating light transmissive substrate.

8. An optoelectronic device as claimed in claim 7 in which the anode layer is in contact with said substrate.

9. An optoelectronic device as claimed in claim 1 in which the first hole injection layer is adjacent the substrate and has a refractive index which is greater than or equal to or substantially matched to the refractive index of the substrate.

10. An optoelectronic device as claimed in claim 9 in which the one or more further hole injection layers has a refractive index which is greater than or equal to or substantially matched to the refractive index of the substrate.

11. An optoelectronic device as claimed in claim 1 in which a further layer comprising a hole transport material is provided between the hole injection layers and the semiconductive layer.

12. An optoelectronic device as claimed in claim 11 in which the hole transport material is undoped.

13. An optoelectronic device as claimed in claim 1 in which the first and the one or more further hole injection layers are p-doped.

14. An optoelectronic device as claimed in claim 1 in which the first and the one or more further hole injection layers comprise conductive polymers.

15. An optoelectronic device as claimed in claim 14 in which the conductive polymers are selected from the group consisting of: PEDOT:PSS, poly(acetylene)s, poly(pyrrole)s, poly(thiophene)s, poly(aniline)s, poly(fluorene)s, poly(3-alkylthiophene)s, poly(3,4-thylenedioxythiophene), polytetrathiafulvalenes, polynaphthalenes, polyparaphylene, poly(paraphenylene sulphide), and poly(paraphenylene vinylene).

16. An optoelectronic device as claimed in claim 1 in which at least one of the first and the one or more further hole injection layers is adapted to provide planarization of the underlying topography.

17. A method of fabricating an optoelectronic device, comprising:
providing an anode layer on a substrate, the anode layer comprising a plurality of electrically conductive tracks connected together and spaced apart from one another with gaps therebetween,
depositing a first hole injection layer from a first solution and one or more further hole injection layers from one or more further solutions over the anode layer and extending across said gaps, wherein the first hole injection layer is provided between the anode layer and the one or more further hole injection layers,
depositing a semiconductive layer over the first and the one or more further hole injection layers, and
depositing a cathode layer over the semiconductive layer, wherein the first hole injection layer has a conductivity greater than 1 S/cm and the first hole injection layer has a conductivity greater than the conductivity of the one or more further hole injection layers.

18. A method as claimed in claim 17 in which one of the first solution and the one or more further solutions has a viscosity greater that the other of the first solution and the one or more further solutions.

19. A method as claimed in claim 17 in which one of the first and the one or more further hole injection layers comprises a cross-linkable polymer which is cross-linked prior to deposition of the other of the first and the one or more further hole injection layers.

20. A method as claimed in claim 17 in which the solvent used in the first solution is different from the solvents used in the one or more further solutions, and the solvents used in the one or more further solutions are selected such that they do not dissolve the first hole injection layer to an appreciable extent during deposition.

* * * * *